US012697779B2

(12) United States Patent
Wiecke et al.

(10) Patent No.: US 12,697,779 B2
(45) Date of Patent: Aug. 4, 2026

(54) APPARATUS, METHODS, AND SYSTEMS FOR CALIBRATING 3D PRINTERS

(71) Applicant: PANTHEON DESIGN LTD., Vancouver (CA)

(72) Inventors: Alex Wiecke, Vancouver (CA); Riley Gunn, Vancouver (CA); Zhenwei Cao, Vancouver (CA)

(73) Assignee: Pantheon Design Ltd., Vancouver (CA)

( * ) Notice: Subject to any disclaimer, the term of this patent is extended or adjusted under 35 U.S.C. 154(b) by 398 days.

(21) Appl. No.: 18/220,160

(22) Filed: Jul. 10, 2023

(65) Prior Publication Data

US 2024/0009930 A1 Jan. 11, 2024

Related U.S. Application Data

(60) Provisional application No. 63/359,865, filed on Jul. 10, 2022.

(51) Int. Cl.
B29C 64/393 (2017.01)
B29C 64/209 (2017.01)
(Continued)

(52) U.S. Cl.
CPC .......... B29C 64/393 (2017.08); B29C 64/209 (2017.08); B33Y 50/02 (2014.12);
(Continued)

(58) Field of Classification Search
CPC .................................................. B29C 64/393
See application file for complete search history.

(56) References Cited

U.S. PATENT DOCUMENTS 9,855,698 B2 1/2018 Perez et al.
10,807,310 B2 10/2020 Herman
(Continued)

FOREIGN PATENT DOCUMENTS

CA 3129413 A1 * 8/2020 .......... B29C 64/336
CN 209273982 U * 8/2019
CN 215320710 U * 12/2021

OTHER PUBLICATIONS

Dragos Ducu, AN1353: Op Amp Rectifiers, Peak Detectors and Clamps, Microchip Technology Inc. (2011), https://ww1.microchip.com/downloads/en/Appnotes/01353A.pdf (last accessed Jul. 14, 2023).

(Continued)

*Primary Examiner* — Suresh Suryawanshi

(57) ABSTRACT

Aspects of apparatus, methods, and systems for calibrating 3D printers are described. One aspect is an apparatus that may comprise: a nozzle support structure that operatively attaches a nozzle to a 3D printer and comprises a strained region that experiences a surface strain of between approximately $1\times10^{-7}$ and approximately $1\times10^{-4}$ responsive to a contact between the nozzle and a print surface; and a semiconductor strain gauge that is attached to the strained region and operable to generate an analog signal and output a digital signal responsive to the surface strain, the semiconductor strain gauge comprising a gauge factor of between approximately 80 and approximately 200, the digital signal being detectable by the 3D printer. Related apparatus, methods, and systems also are described.

20 Claims, 10 Drawing Sheets

(51) Int. Cl.

| | |
|---|---|
| *B33Y 50/02* | (2015.01) |
| *B33Y 30/00* | (2015.01) |
| *G01L 1/22* | (2006.01) |
| *H03K 3/3565* | (2006.01) |

(52) U.S. Cl.
CPC ............. *B33Y 30/00* (2014.12); *G01L 1/2293* (2013.01); *H03K 3/3565* (2013.01)

(56) References Cited

U.S. PATENT DOCUMENTS

| | | | |
|---|---|---|---|
| 2017/0050382 | A1 | 2/2017 | Minardi et al. |
| 2017/0165920 | A1* | 6/2017 | Leavitt .................. B29C 64/118 |
| 2018/0141277 | A1* | 5/2018 | Warner .................. B33Y 50/02 |
| 2019/0234815 | A1* | 8/2019 | Rosinski .................. G01M 5/00 |
| 2019/0257704 | A1* | 8/2019 | Steyn ......................... G01L 1/22 |
| 2022/0024128 | A1* | 1/2022 | Gjovik .................. B29C 64/118 |

OTHER PUBLICATIONS

Fairchild Semiconductor, AN-140 CMOS Schmitt Trigger—A Uniquely Versatile Design Component, On Semiconductor (1997), https://www.onsemi.cn/pub/collateral/an-140cn.pdf (last accessed Jul. 14, 2023).

Massachusetts Institute of Technology, How to Bias an OP-AMP, MAS.863 (date unknown), https://resenv.media.mit.edu/classarchive/MAS836/bias.pdf. (Last accessed Jul. 14, 2023).

Microchip Technology Inc., AN4225: Maximizing the Signal: Tips and Tricks to Properly Acquiring Analog Signals (2021), https://ww1.microchip.com/downloads/aemDocuments/documents/MCU08/ApplicationNotes/Application Notes/Max-Signal-Properly-TipsTrick-Acq-Analog-Signals-DS00004225.pdf (last accessed Jul. 17, 2023).

Xi'An Utop Measurement Instrument Co., Ltd. Semiconductor Strain Gauges, utopsensors.com, https://www.utopsensors.com/Content/upload/pdf/201816244/1000-ohms-semiconductor-strain-gauge.pdf?rnd=255 (last accessed Jul. 14, 2023).

* cited by examiner

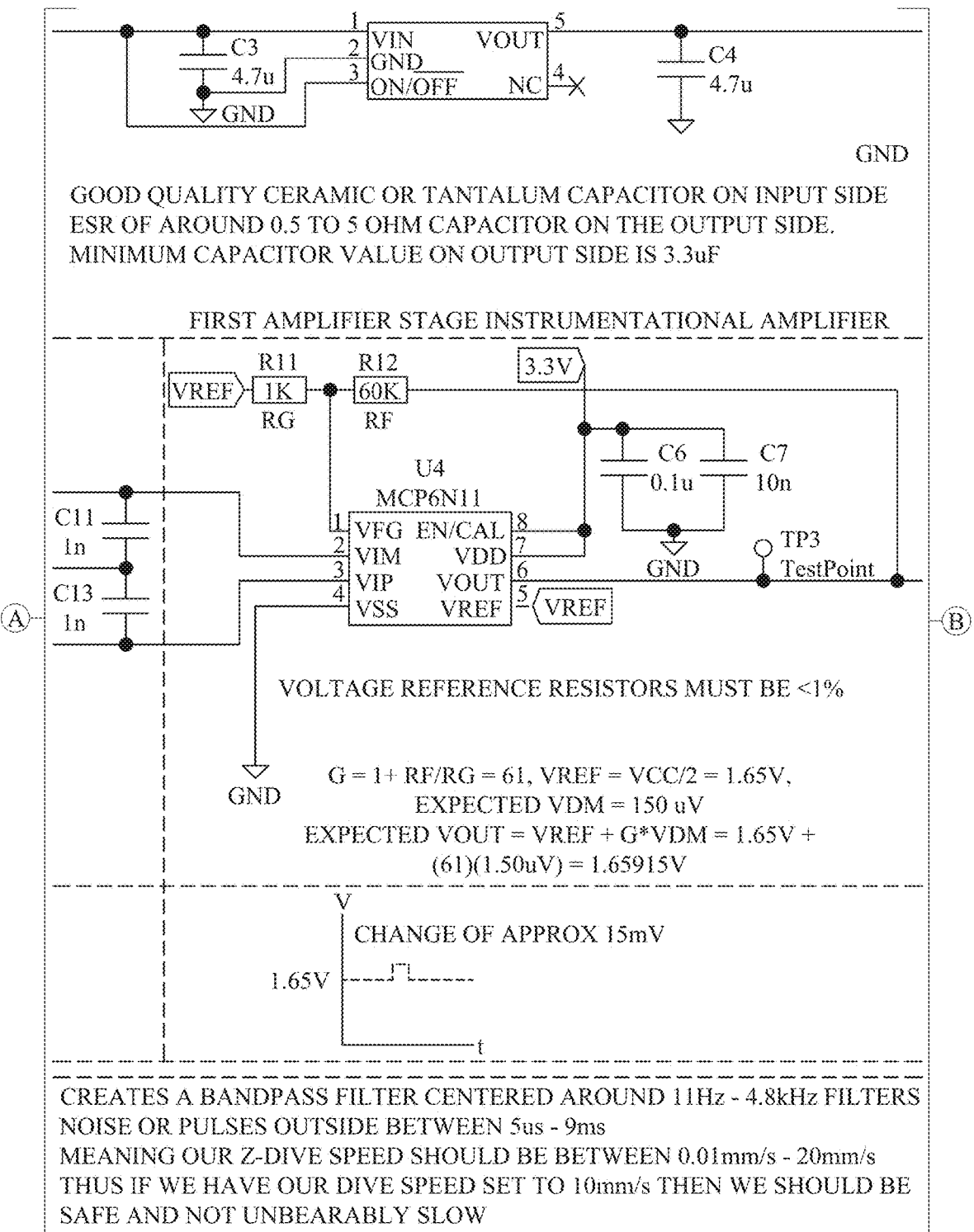

GOOD QUALITY CERAMIC OR TANTALUM CAPACITOR ON INPUT SIDE
ESR OF AROUND 0.5 TO 5 OHM CAPACITOR ON THE OUTPUT SIDE.
MINIMUM CAPACITOR VALUE ON OUTPUT SIDE IS 3.3uF

FIRST AMPLIFIER STAGE INSTRUMENTATIONAL AMPLIFIER

VOLTAGE REFERENCE RESISTORS MUST BE <1%

$G = 1+ RF/RG = 61$, VREF = VCC/2 = 1.65V,
EXPECTED VDM = 150 uV
EXPECTED VOUT = VREF + G*VDM = 1.65V +
(61)(1.50uV) = 1.65915V

CHANGE OF APPROX 15mV

CREATES A BANDPASS FILTER CENTERED AROUND 11Hz - 4.8kHz FILTERS
NOISE OR PULSES OUTSIDE BETWEEN 5us - 9ms
MEANING OUR Z-DIVE SPEED SHOULD BE BETWEEN 0.01mm/s - 20mm/s
THUS IF WE HAVE OUR DIVE SPEED SET TO 10mm/s THEN WE SHOULD BE
SAFE AND NOT UNBEARABLY SLOW

FIG. 6B

TEST POINTS
TP1 = STRAIN OUTPUT SIGNAL
TP2 = EXCITATION VOLTAGE
TP3 = POST FIRST AMPLIFICATION
TP4 = POST 2ND AND 3RD AMPLIFICATION
TP5 = GND

APPARATUS, METHODS, AND SYSTEMS FOR CALIBRATING 3D PRINTERS

CROSS-REFERENCE TO RELATED APPLICATIONS

This application claims the benefit of priority to Canadian Patent Application No. 3,199,791, filed May 17, 2023, and U.S. Provisional Patent Application No. 63/359,865, filed Jul. 10, 2022, the entireties of which are hereby incorporated by reference into the enclosed application.

TECHNICAL FIELD

Aspects of this disclosure relate generally to apparatus, methods, and systems for calibrating 3D printers. Some aspects are optimized to calibrate high-speed, high acceleration 3D printers.

BACKGROUND

Modern 3D printers typically have a rigid frame structure with a plurality of electromechanical devices operable to "print" a thermoplastic onto a print surface by moving a 3D print head with a nozzle horizontally while extruding molten layers of the thermoplastic from the nozzle onto a vertically moveable print surface. Modern 3D printers can print a 3D model with computer-controlled processes for: (1) printing a layer of the plastic onto the print surface with the print head; (2) moving the print surface vertically downwardly from the print head; (3) printing a subsequent layer of the plastic on top of the layer printed in step (1); and repeating steps (1) through (3) with additional layers until the 3D model has been "printed."

Computer-controlled 3D printing processes typically require precise calibration of a Z-offset between a nozzle probe and a tip of the nozzle to account for a wide range of variables including manufacturing tolerances, wear, temperature, dirt/debris, or user error. Without precise calibration of the Z-offset with the nozzle probe, these otherwise unmanaged variables will likely cause reductions in print quality or print failure at a wide range of print speeds because the computer controlling the process will not know where the tip of the nozzle is relative to the print surface. A process called "nozzle probing" may be used to calibrate the Z-offset. Nozzle probing involves contacting the print surface with the tip of the nozzle and measuring the resulting forces with a traditional resistive strain gauge mounted on the 3D print head, eliminating the nozzle probe.

Nozzle probing resolves some known problems and introduces new ones. For example, traditional resistive strain gauges typically have a gauge factor of approximately 1, meaning that their supporting structures must be designed to experience higher strains for the same sensitivity, making them less stiff and thus unsuitable for high-speed, high acceleration printing. As further example, semiconductor strain gauges may have gauge factors enabling far more sensitivity, but also may experience substantially larger temperature drift due to drift in resistance and gauge factor as they heat up, making them unsuitable without further improvement.

SUMMARY

Aspects of this disclosure comprise apparatus, methods, and systems for calibrating 3d printers.

One apparatus may comprise a nozzle support structure that operatively attaches a nozzle to a 3D printer and comprises a strained region that experiences a surface strain of between approximately $1\times10^{-7}$ and approximately $1\times10^{-4}$ responsive to a contact between the nozzle and a print surface; and/or a semiconductor strain gauge that is attached to the strained region and operable to generate an analog signal and output a digital signal responsive to the surface strain, the semiconductor strain gauge comprising a gauge factor of between approximately 80 and approximately 200, the digital signal being detectable by the 3D printer.

Another exemplary apparatus may comprise a nozzle operable to extrude a molten flow of 3D printable material onto a print surface when attached to a 3D printer; a nozzle support structure that operatively attaches a nozzle to the 3D printer and comprises a strained region that experiences a surface strain of between approximately $1\times10^{-7}$ and approximately $1\times10^{-4}$ responsive to a contact between the nozzle and a print surface; and/or a semiconductor strain gauge that is attached to the strained region and operable to generate an analog signal and output a digital signal responsive to the surface strain, the semiconductor strain gauge comprising a gauge factor of between approximately 80 and approximately 200, the digital signal being detectable by the 3D printer.

Another exemplary apparatus may comprise an extruder body that outputs a molten flow of 3D printable material; a nozzle operable to extrude the molten flow of 3D printable material onto a print surface; a nozzle support structure that operatively attaches the nozzle to the extruder body and comprises a strained region that experiences a surface strain of between approximately $1\times10^{-7}$ and approximately $1\times10^{-4}$ responsive to a contact between the nozzle and a print surface; and/or a semiconductor strain gauge that is attached to the strained region and operable to generate an analog signal and output a digital signal responsive to the surface strain, the semiconductor strain gauge comprising a gauge factor of between approximately 80 and approximately 200, the digital signal being detectable by the 3D printer.

In keeping with these examples, the semiconductor strain gauge may be operable to generate the analog signal and output the digital signal according to methods described herein.

One method may comprise outputting, with a Wheatstone bridge and a semiconductor strain gauge attached to a strained region of a nozzle support structure that operatively attaches a nozzle to a 3D printer, an analog signal responsive to a contact between the nozzle and a print surface, the semiconductor strain gauge comprising a gauge factor of between approximately 80 and approximately 200; removing, with an R-C high-pass filter, a temperature drift portion of the analog signal during a filter stage comprising a corner frequency of between approximately 1 Hz and approximately 100 Hz; increasing, with an instrumentation amplifier, a resistance to power supply noise of the analog signal during an amplifier stage comprising a gain of approximately 50 to approximately 1000; performing, with an AC-Coupled amplifier, an AC-Coupled amplifier stage on the analog signal comprising a gain of approximately 50 to approximately 1000; converting, with a Schmitt trigger, the analog signal into a digital signal for detecting the contact; and/or detecting, with the 3D printer, the contact responsive to the digital signal.

Another exemplary method may comprise outputting, with a voltage divider and a semiconductor strain gauge attached to a strained region of a nozzle support structure that operatively attaches a nozzle to the 3D printer, an analog signal responsive to a contact between the nozzle a print surface, the semiconductor strain gauge comprising a gauge factor of between approximately 80 and approximately 200; removing, with an R-C high-pass filter, a temperature drift portion of the analog signal with a filter stage comprising a corner frequency of between approximately 1 Hz and approximately 100 Hz; performing, with an AC-Coupled amplifier, one or more AC-Coupled amplifier stages on the analog signal comprising a gain of approximately 50 to approximately 1,000,000; converting, with a Schmitt trigger, the analog signal into a digital signal; and/or detecting, with the 3D printer, the contact responsive to the digital signal.

Another exemplary method may comprise outputting, with a Wheatstone bridge and a semiconductor strain gauge attached to a strained region of a nozzle support structure that operatively attaches a nozzle to the 3D printer, an analog signal responsive to a contact between the nozzle and a print surface, the semiconductor strain gauge comprising a gauge factor of between approximately 80 and approximately 200, each leg of the Wheatstone bridge experiencing equal voltage variations of opposite polarity; removing a temperature drift portion of the analog signal by passing it through one or more filter stages comprising an R-C high-pass filter with a corner frequency between approximately 1 and approximately 100 Hz; increasing, with an instrumentation amplifier, a resistance to power supply noise of the analog signal during an amplifier stage comprising a gain of approximately 50 to approximately 1000; performing, with an AC-Coupled amplifier, an AC-Coupled amplifier stage on the analog signal comprising a gain of approximately 50 to approximately 1000; converting, with a Schmitt trigger, the analog signal into a digital signal; and/or detecting, with the 3D printer, the contact responsive to the digital signal.

Another exemplary method may comprise calibrating a Z-offset between a print surface and a nozzle by operatively attaching the nozzle to a 3D printer with a nozzle support structure; and calibrating a Z-offset between a print surface and the nozzle by: moving, with the 3D printer, the nozzle to a plurality of different locations on the print surface; at each location plurality of different locations: causing, with the 3D printer, a contact between the nozzle and the print surface that causes a strained region of the nozzle support structure to experience a surface strain of between approximately $1 \times 10^{-7}$ and approximately $1 \times 10^{-4}$ responsive to the contact; generating, with a semiconductor strain gauge attached to a strained region of the nozzle support structure, an analog signal responsive to the surface strain, the semiconductor strain gauge comprising a gauge factor of between approximately 80 and approximately 200; and converting, with the semiconductor strain gauge, the analog signal into a digital signal detectable by the 3D printer; and/or determining, with the 3D printer, the Z-offset at each location of the plurality of different locations based the digital signal associated with that location.

As a further example, another apparatus may comprise a nozzle support structure that operatively attaches a nozzle to a 3D printer and comprises a strained region that experiences a surface strain of between approximately $1 \times 10^{-7}$ and approximately $1 \times 10^{-4}$ responsive to a contact between the nozzle and a print surface; and a semiconductor strain gauge that is attached to the strained region and operable to generate an analog signal and output a digital signal responsive to the surface strain, the semiconductor strain gauge comprising a gauge factor of between approximately 80 and approximately 200, the digital signal being detectable by the 3D printer.

The nozzle support structure may extend outwardly from an extruder body operable to output a molten flow of 3D printable material. The nozzle support structure may comprise metallic structures that are formed integral with the extruder body. A flexible portion of the nozzle support structure may flex when a tip of the nozzle contacts the print surface; and a flexure of the flexible portion may cause the strained region to experience the surface strain. The nozzle support structure may comprise: a nozzle block extending outwardly from the extruder body for attachment to the nozzle and a heat block; a hinge connector arm extending outwardly from the extruder body; and a flexure bearing hinge that extends between the nozzle block and the hinge connector arm and flexes when a tip of the nozzle contacts the print surface, wherein a flexure of the flexure bearing hinge causes the strained region to experience the surface strain. The nozzle block, the hinge connector arm, and the flexure bearing hinge are made of the same material and the flexure bearing hinge consists of a living hinge connecting the nozzle block and the hinge connector arm.

The nozzle block may comprise a long leg extending outwardly from the extruder block; a short leg connected to the flexure bearing hinge; a bottom leg connecting the long leg and the short leg; and/or an interior space defined by interior surfaces of the extruder block, the long leg, the bottom leg, and the short leg. The apparatus may comprise a heat block attached to the bottom leg and the nozzle; a delivery tube extending from the extruder body, through the interior space, through the bottom leg, through the heat block, and into the nozzle; and a heat sink surrounding a portion of the delivery tube in the interior space. The apparatus may comprise a hinge connector arm base extending outwardly from the extruder body to support the hinge connector arm. A rigidity of the hinge connector arm base may greater than a rigidity of the hinge connector arm. A bottom surface of the hinge connector arm base and a top surface of the short leg may be spaced apart define a flexure gap that permits the top surface to move toward the bottom surface when the flexure bearing hinge flexes. The strained portion may comprise an outside surface of the hinge connector arm and the semiconductor strain gauge may be located on the outside surface. The strained portion may comprise an outside surface of the nozzle support structure that experiences the surface strain when a flexible portion of the nozzle support structure flexes responsive to the contact.

The semiconductor strain gauge may comprise one or more of: a Wheatstone bridge operable to output the analog signal responsive to the contact; an R-C high-pass filter operable to remove a temperature drift portion of the analog signal; an instrumentation amplifier operable to increase a resistance to power supply noise of the analog signal; an AC-Coupled amplifier operable to perform an AC-Coupled amplifier stage on the analog signal; a peak-hold circuit operable to extend a duration of short pulses of the analog signal; and/or a Schmitt trigger operable to convert the analog signal into the digital signal after passing through one or more of the R-C high-pass filter, the instrumentation amplifier, the AC-Coupled amplifier, and the peak-hold circuit. Each leg of the Wheatstone bridge may experience equal voltage variations of opposite polarity.

The semiconductor strain gauge may be operable to generate the analog signal and output the digital signal by outputting, with a Wheatstone bridge and the semiconductor strain gauge, the analog signal responsive to the contact;

removing, with an R-C high-pass filter, a temperature drift portion of the analog signal during a filter stage comprising a corner frequency of between approximately 1 Hz and approximately 100 Hz; increasing, with an instrumentation amplifier, a resistance to power supply noise of the analog signal during an amplifier stage comprising a gain of approximately 50 to approximately 1000; performing, with an AC-Coupled amplifier, an AC-Coupled amplifier stage on the analog signal comprising a gain of approximately 50 to approximately 1000; and/or converting, with a Schmitt trigger, the analog signal into the digital signal. As described herein, each leg of the Wheatstone bridge may experience equal voltage variations of opposite polarity; and the semiconductor strain gauge may extend, with a peak-hold circuit, a duration of short pulses of the analog signal.

The semiconductor strain gauge may comprise one or more of: a voltage divider operable to output the analog signal responsive to the contact; an R-C high-pass filter operable to remove a temperature drift portion of the analog signal; an AC-Coupled amplifier operable to perform an AC-Coupled amplifier stage on the analog signal; a peak-hold circuit operable to extend a duration of short pulses of the analog signal; and/or a Schmitt trigger operable to convert the analog signal into the digital signal after passing through one or more of the R-C high-pass filter, the AC-Coupled amplifier, and the peak-hold circuit.

The semiconductor strain gauge may be operable to generate the analog signal and output the digital signal by: outputting, with a voltage divider and the semiconductor strain gauge, the analog signal responsive to the contact; removing, with an R-C high-pass filter, a temperature drift portion of the analog signal with a filter stage comprising a corner frequency of between approximately 1 Hz and approximately 100 Hz; performing, with an AC-Coupled amplifier, one or more AC-Coupled amplifier stages on the analog signal comprising a gain of approximately 50 to approximately 1,000,000; and/or converting, with a Schmitt trigger, the analog signal into the digital signal. The semiconductor strain gauge also may extend, with a peak-hold circuit, a duration of short pulses of the analog signal.

Another apparatus may comprise the nozzle, the 3D printer, and the print surface, wherein the strained portion comprises an outside surface of the nozzle support structure that experiences the surface strain when a hinge of the nozzle support structure flexes responsive to the contact. For example, the 3D printer may be operable with the semiconductor strain gauge to calibrate a Z-offset between the print surface and the nozzle by moving, with a processor of the 3D printer, the nozzle to a plurality of different locations on the print surface; and, at each location plurality of different locations causing, with the processor of the 3D printer, at least one contact between the nozzle and the print surface that causes the strained region to experience the surface strain; generating, with the semiconductor strain gauge, the analog signal responsive to the surface strain; converting, with the semiconductor strain gauge, the analog signal into the digital signal; outputting, with the semiconductor strain gauge, the digital signal to the 3D printer; determining, with the processor of the 3D printer, the Z-offset based on the digital signal.

Additional aspects of apparatus, methods, and systems for calibrating 3D printers are now described in relation to these and other examples.

BRIEF DESCRIPTION OF THE DRAWINGS

The accompanying drawings, which are incorporated in and constitute part of this disclosure, illustrate exemplary aspects that, together with the written descriptions, serve to explain the principles of this disclosure. Numerous aspects are shown conceptually in the drawings and particularly described, pointed out, and taught in the written descriptions. Some structural and operational aspects may be better understood by referencing the written portions together with the accompanying drawings, of which:

FIG. 6B depicts a center-left portion of an exemplary semiconductor strain gauge operable with the FIG. 1 apparatus;

Figure 1:
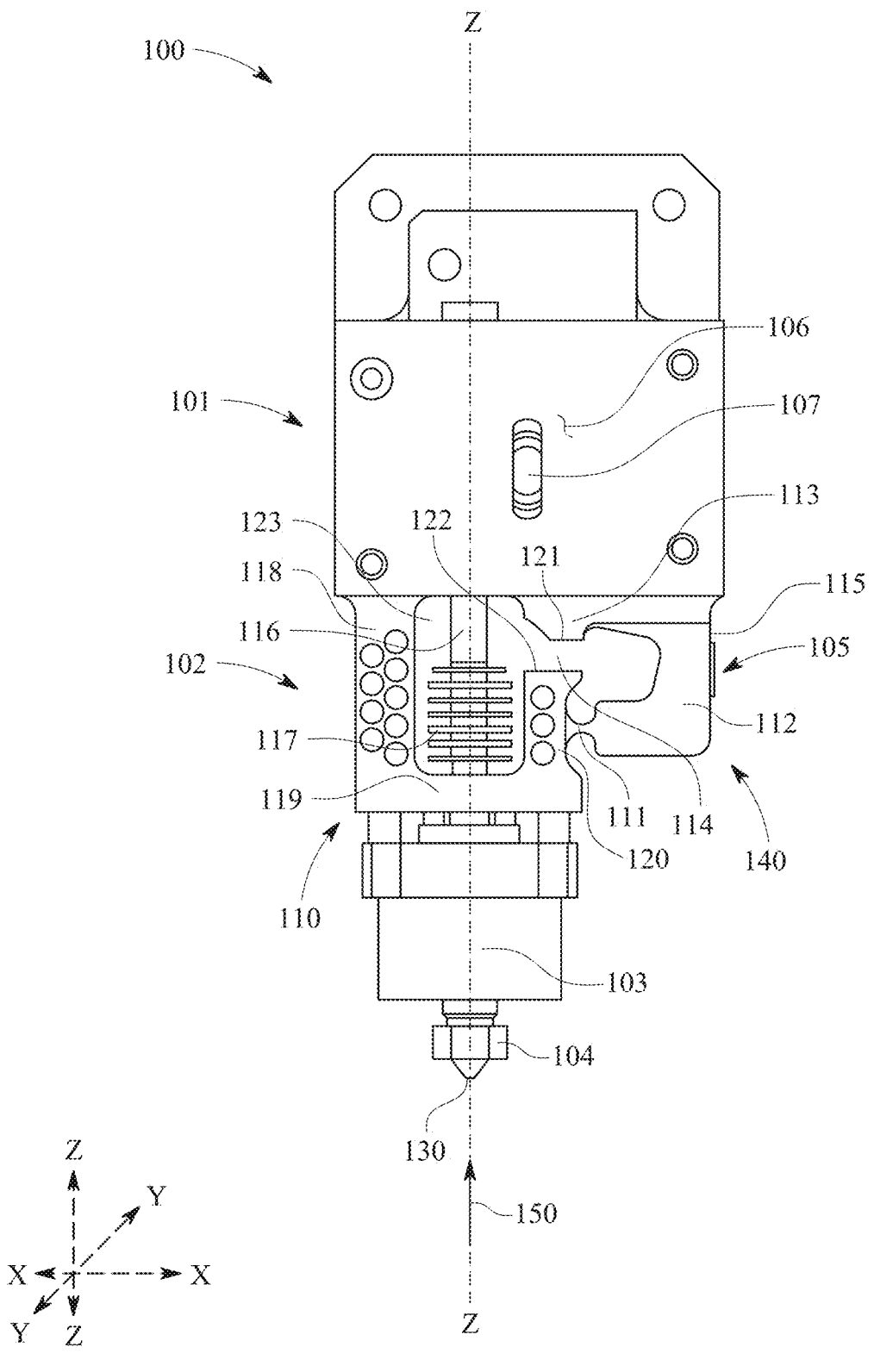
FIG. 1 depicts an exemplary apparatus according to this disclosure.

Aspects of the examples illustrated in the drawings may be explained further by way of citations to the drawing and element numbers in the text of the description. The drawings and any citations thereto are provided for illustration purposes, and to further clarify the description of the present disclosure and are not intended to limit the present disclosure unless claimed.

DETAILED DESCRIPTION

Aspects of the present disclosure are not limited to the exemplary structural details and component arrangements described in this description and shown in the accompanying drawings. Many aspects of this disclosure may be applicable to other aspects and/or capable of being practiced or carried out in various variants of use, including the examples described herein.

Throughout the written descriptions, specific details are set forth to provide a more thorough understanding to persons of ordinary skill in the art. For convenience and ease of description, some well-known elements may be described conceptually to avoid unnecessarily obscuring the focus of this disclosure. In this regard, the written descriptions and accompanying drawings should be interpreted as illustrative rather than restrictive, enabling rather than limiting.

Exemplary aspects of apparatus, methods, and systems for calibrating 3D printers are described. Some aspects are optimized to calibrate high-speed, high acceleration 3D printers like those described in U.S. patent application Ser. No. 17/826,115, filed May 26, 2022, the entirety of which is incorporated by reference into this disclosure (hereinafter the '115 Application). Some exemplary aspects are described with reference to certain movable technologies (e.g., 3D printers), certain forces caused by those technologies (e.g., by moving the printhead of a 3D printer), and certain support structures for handling the forces (e.g., a frame). Descriptions of these exemplary aspects are provided for convenience to assist the reader and not intended to limit this disclosure unless claimed. Accordingly, any apparatus, methods, and systems for calibrating 3D printers described herein with reference to these exemplary aspects may be broadly claimed.

Several exemplary reference axes are described, including a first horizontal axis X-X, a second horizontal axis Y-Y, a vertical axis Z-Z. Some directions, elements, forces, and/or movements are described relative to one or more of these axes. For example, different structural elements may extend horizontally in a plane X-Y or extend vertically along axis Z-Z. Different structural elements may have different and/or irregular cross-sectional shapes dimensions along axis X-X, Y-Y, and/or Z-Z. Some elements may be described as "elongated," meaning that they have a length greater than a width along any one of these axes. These relative terms are provided for convenience to assist the reader and do not limit this disclosure unless claimed.

Inclusive terms such as "comprises," "comprising," "includes," "including," and variations thereof, are intended to cover a non-exclusive inclusion, such that any motion isolation apparatus, methods, and systems described herein, or element(s) thereof described as comprising a list of elements does not include only those elements but may include other elements not expressly listed and/or inherent thereto. Unless stated otherwise, the term "exemplary" means "example" rather than "ideal." Various terms of approximation may be used, including "approximately" and "generally." Approximately means "roughly" or within 10% of a stated number or outcome and generally means "usually" or more than a 50% probability of a stated number or outcome.

Connective terms such as "attached to," "attachable to," and "attaching" are intended to generically describe a structural connection between two or more elements. Some structural connections may be "rigidly attached" so that the connected elements are generally non-rotatable relative to one another, as when the elements are formed together (e.g., bolted or welded) and cannot be rotated independently without deflecting relative to one another or being damaged. Other structural connections may be "rotatably or movably attached" so that the connected elements are coupled together to permit movements relative to one another, as when the elements are pinned together (e.g., or any type of rotating, sliding, and/or telescoping connection) and can be rotated freely and independently without damage. Still other connections may be "resiliently attached" so that the connected elements are resiliently deflectable relative to one another, as when the elements form a moment connection that allows the transfer of bending moment forces between the elements, causing deflections that allow for limited rotations. Unless stated otherwise, these exemplary connective terms and their modifiers may comprise any such variations.

Aspects of any exemplary computing device are described. Functional terms such as "processing," "computing," "calculating," "determining," "displaying," and the like, may refer to actions and processes performable by the computing, which may comprise any type of software and/or hardware. The software of the computing device may comprise program objects (e.g., lines of codes) executable to perform various functions. Each program object may comprise a sequence of operations leading to a desired result, such as an algorithm. The operations may require or involve physical manipulations of physical quantities, such as electrical or magnetic signals capable of being stored, transferred, combined, compared, and otherwise manipulated.

The signals may be described conceptually as bits, characters, elements, numbers, symbols, terms, values, or the like.

The hardware of the computing device also may comprise any known technologies for storing the program objects and any data associated therewith. For example, the program objects may be stored in any machine (e.g., computer) readable storage medium in communication with the processing unit, including any mechanism for storing or transmitting data and information in a form readable by a machine (e.g., a computer). Exemplary storage mediums may comprise read only memory ("ROM"); random access memory ("RAM"); erasable programmable ROMs ("EPROMs"); electrically erasable programmable ROMs ("EEPROMs"); magnetic or optical cards or disks; flash memory devices; and/or any electrical, optical, acoustical, or other form of propagated signals (e.g., carrier waves, infrared signals, digital signals, etc.).

Some aspects of the present disclosure are described with reference to methods, steps of which may be performable with the computing device. To help orient the reader, some methods may comprise steps described with reference to a numerical order. The sequence of events may be important in some instances, although that is not required unless claimed. For example, the numerical order of the steps may describe a sequence of operation that is performable by the computing element to realize specific processing benefits, such as improving a computational performance and/or an operational efficiency.

Figure 2:
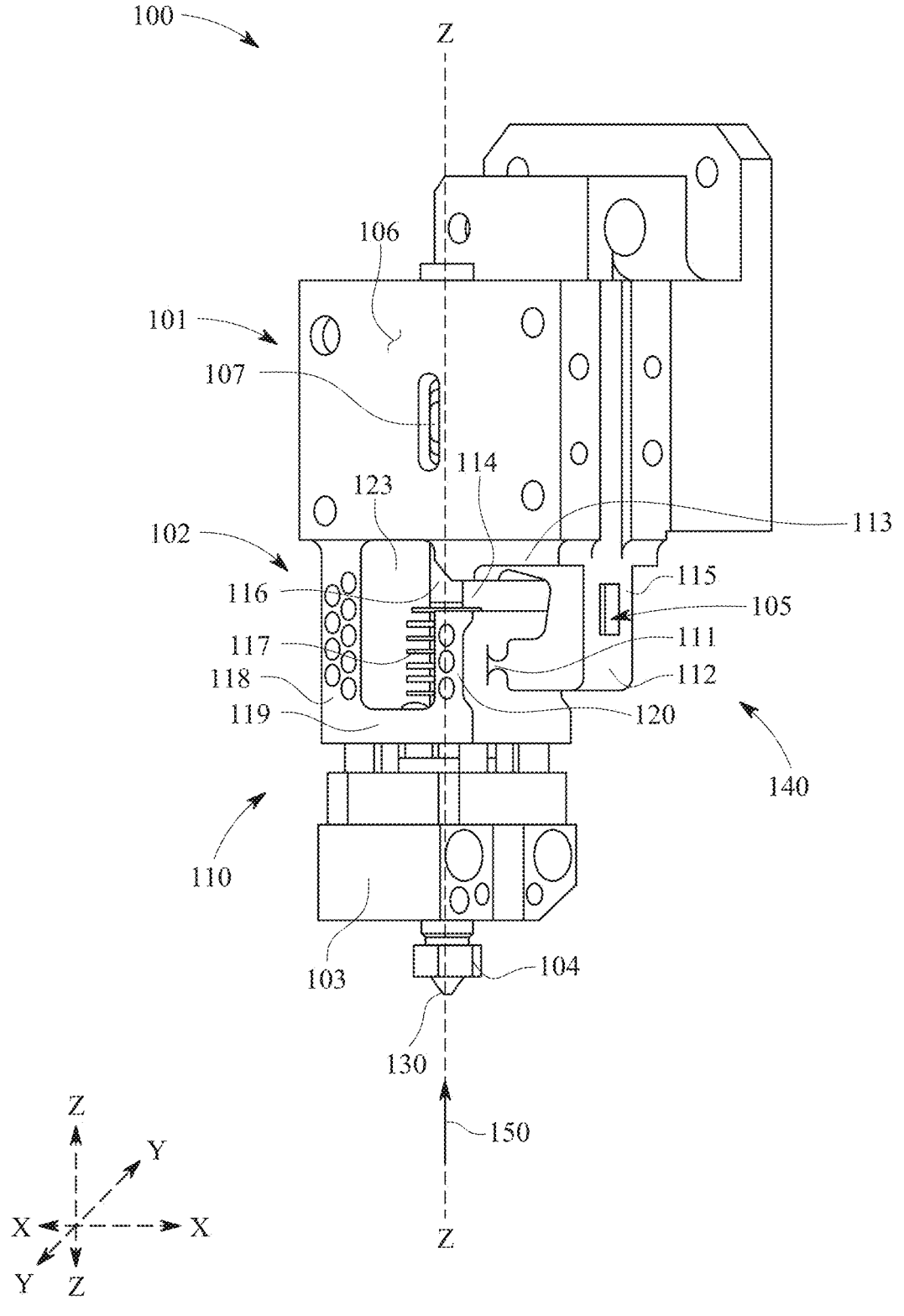
FIG. 2 depicts a perspective view of the FIG. 1 apparatus.

Aspects of this disclosure are now described with reference to exemplary apparatus, methods, and systems for calibrating 3D printers, starting with an exemplary apparatus 100 comprising an electronic circuit and mechanical structure operable to detect contact between a nozzle of a 3D printer and a print surface for the purpose of setting tool height. The 3D printer may be comparable to 3D printer 360 of the '115 Application incorporated into this disclosure; and the print surface may comprise a bed of the 3D printer, such as 3D print surface 307 of the '115 Application. As shown in FIGS. 1 and 2, for example, apparatus 100 may comprise an extruder body 101, a nozzle support structure 102, a heat block 103, a nozzle 104, and a semiconductor strain gauge 105.

Extruder body 101 may comprise a structure (e.g., a metallic structure) defining various attachments surfaces, mounting surfaces, openings, and interior cavities. As shown in FIGS. 1 and 2, for example, extruder body 101 may comprise an interior cavity 106 containing a drive roll bearing 107 operable to advance printable material through extruder 101 body toward nozzle 104. In keeping with this example, extruder body 101 may be milled or laser cut from a lightweight metal like aluminum. Elements like nozzle support structure 102 may be milled or laser cut to be part of extruder body 101, as now described.

Nozzle support structure 102 may comprise different structures (e.g., different metallic structures) extending outward from a bottom portion of extruder body 101 to provide attachment points for other elements of apparatus 100 (e.g., such as heat block 103) and react in a predictable manner when a tip of nozzle 104 contacts a print surface during operation of a 3D printer, such as during a calibration method for the 3D printer. As shown in FIGS. 1 and 2, for example, nozzle support structure 102 may comprise a nozzle block 110, a flexure bearing hinge 111, a hinge connector arm 112, a hinge connector arm base 113, and a flexure gap 114.

As shown in FIGS. 1 and 2, for example, nozzle block 110 may comprise a structure (e.g., a metallic structure) defining an "L-shape" extending downward from extruder body 101. Long, bottom, and short legs 118, 119, and/or 120 of the L-shaped structure may have holes extending therethrough to reduce their weight and optimize their flexural and/or heat transfer characteristics. Bottom leg 118 may comprise surfaces, structures, and openings operable to attach heat block 103. As shown in FIGS. 1 and 2, for example, a delivery tube 116 may extend from interior cavity 106, through an opening extending through bottom leg 118, and into heat block 103. In this example, an interior space 123 between long leg 118 and short leg 120 may be spaced apart to provide room for a heat sink 117 that encircles a portion of tube 116 and is spaced apart from interior surfaces of legs 118, 120 to define a heat break similar to that described in U.S. Pat. No. 10,875,244, filed May 16, 2018, the entirety of which is incorporated by reference into this disclosure.

Flexure bearing hinge 111 may comprise a flexible portion of the nozzle support structure 102 that is intended to flex when a tip 130 nozzle 104 contacts a print surface. For example, the flexible portion may be narrowed relative to other portions of flexure bearing hinge 111 and thus alternatively described as a narrowed portion. As a further example, nozzle block 110, flexure bearing hinge 111, and connector arm 112 may be made from the same material such that flexure bearing hinge 111 may alternatively be described as a living hinge 111.

Hinge connector arm base 113 may comprise a rigid foundation for hinge connector arm 112 that is comparatively much stiffer than the flexible portion of flexure bearing hinge 111 so that a greater number of forces may be concentrated at the flexible portion when tip 130 contacts the print surface. As shown in FIGS. 1 and 2, for example, the flexible portion of flexure bearing hinge 111 may flex responsive to a vertically directed reaction force applied to tip 130 in the 'Z' direction when contacting the print surface, such as probing force 150 described below.

As shown in FIG. 1, for example, flexure gap 114 may extend in the Z direction between a bottom surface 121 of hinge connector arm base 113 and a top surface 122 of short leg 120 to provide room for top surface 122 to move toward bottom surface 121 when the flexible portion of flexure bearing hinge 111 flexes responsive to the vertically directed reaction force. As shown in FIGS. 1 and 2, for example, aspects of the flexible portion of flexure bearing hinge 111—such as its narrowness, its vertical position on short leg 120, its spacing away from extruder body 101 in the Z direction, its relative stiffness, its curvature, and/or the size of flexure gap 114—may be optimized to cause hinge connector arm 112 to experience a surface strain of between approximately $1\times10^{-7}$ and approximately $1\times10^{-4}$ responsive to contact between tip 130 of nozzle 104 and the print surface.

Nozzle support structure 102 may operatively attach nozzle 104 to extruder body 101 which itself may be operably attached to a 3D printer. As shown in FIG. 1, for example, because of flexure bearing hinge 111 and flexure gap 114, nozzle support structure 102 may have a strained region 140 that experiences a surface strain when tip 130 contacts a print surface. Strained region 140 may comprise one or more different elements of nozzle support structure 102. As shown in FIG. 1, for example, aspects of apparatus 100 such as extruder body 101 and nozzle support structure 102 may be constructed so that some portion of nozzle support structure 102 experiences a surface strain of between approximately $1\times10^{-7}$ and approximately $1\times10^{-4}$ when tip 130 contacts the print surface. As shown in FIG. 1, for example, strained region 140 may comprise an outside surface 115 of hinge connector arm 112 because it will experience a measurable amount of surface strain whenever tip 130 contacts with the print surface due to the above-described structural interactions between nozzle block 110, flexural hinge 111, and hinge connector arm 112 described herein, such as between approximately $1\times10^{-7}$ and approximately $1\times10^{-4}$.

As shown in FIGS. 1 and 2, for example, heat block 103 may comprise an internal cavity with thermal elements operable to receive printable material from tube 116 at temperatures within a target temperature range, apply heat to melt the printable material down to a printable temperature, and direct a molten flow of the printable material toward nozzle 104. As also shown in FIGS. 1 and 2, nozzle 104 may comprise any type of 3D printing nozzle or its 2D equivalent.

Aspects of semiconductor strain gauges are now described with reference to semiconductor strain gauge 105. As shown in FIGS. 1 and 2, for example, semiconductor strain gauge 105 may have a big sensitivity coefficient, a small mechanical lag wide resistance range, and a small transversal effect. As a further example, semiconductor strain gauge 105 may be like those sold by the Xi' an UTOP Measurement Instrument Co., Ltd. at https://www.utopsen-sors.com. As shown in FIGS. 1 and 2, for example, semiconductor strain gauge 105 may have a gauge factor of between approximately 80 and approximately 200 and attached to outside surface 115 of hinge connector arm 112 with an adhesive such as one of cyanoacrylate or phenolic type. Attaching semiconductor strain gauge 105 to outside surface 115 is desirable because of its easy access, making it suitable for placement on both new and existing 3D print heads; and because outer surface 115 is a portion of strained region 140 likely to experience a high strain in the direction of highest strain.

As shown in FIGS. 1 and 2, for example, where it is attached to outer surface 115, semiconductor strain gauge 105 may be stretched by deformation of outer surface 115 responsive to a probing force 150 that is applied to tip 130 in the 'Z' direction when it contacts the print surface as part of a calibration method executed by the 3D printer (e.g., like method 500 described below). Probing force 150 may be between approximately 10NJ, approximately 100NJ, or some other amount sufficient to stretch outer surface 115 by flexing flexure bearing hinge 111. As outer surface 115 stretches, semiconductor strain gauge 105 attached thereto may experience a change in resistance equal to the product of: (a) its unstrained resistance; multiplied by (b) its Gauge Factor; multiplied by (c) its total strain. This change in resistance may be described as an analog signal that exists but is not yet available to a 3D printer without additional hardware.

Aspects of this disclosure are now described with reference to different methods for making the analog signal output by semiconductor strain gauge 105 available to a 3D printer as a digital signal useful for detecting contacts between tip 130 and the print surface.

Figure 3:
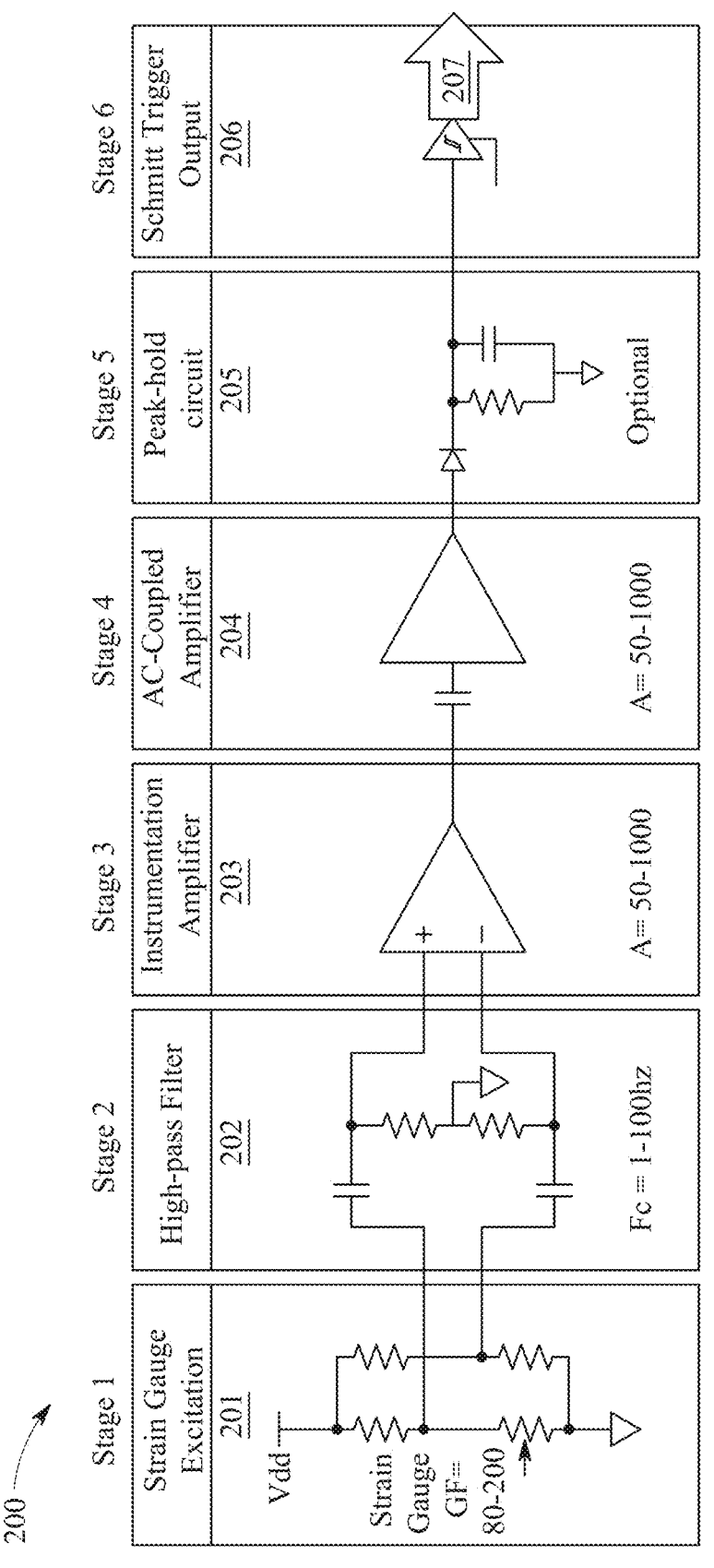
FIG. 3 depicts an exemplary method performable by the FIG. 1 apparatus.

In one aspect shown in FIG. 3, for example, semiconductor strain gauge 105 may comprise circuitry operable with a 3D printer to perform a method 200 for detecting contact between nozzle 104 and the print surface. An illustrative example of the circuitry required for semiconductor strain gauge 105 to perform method 200 is shown in FIG. 6.

Figure 6A:
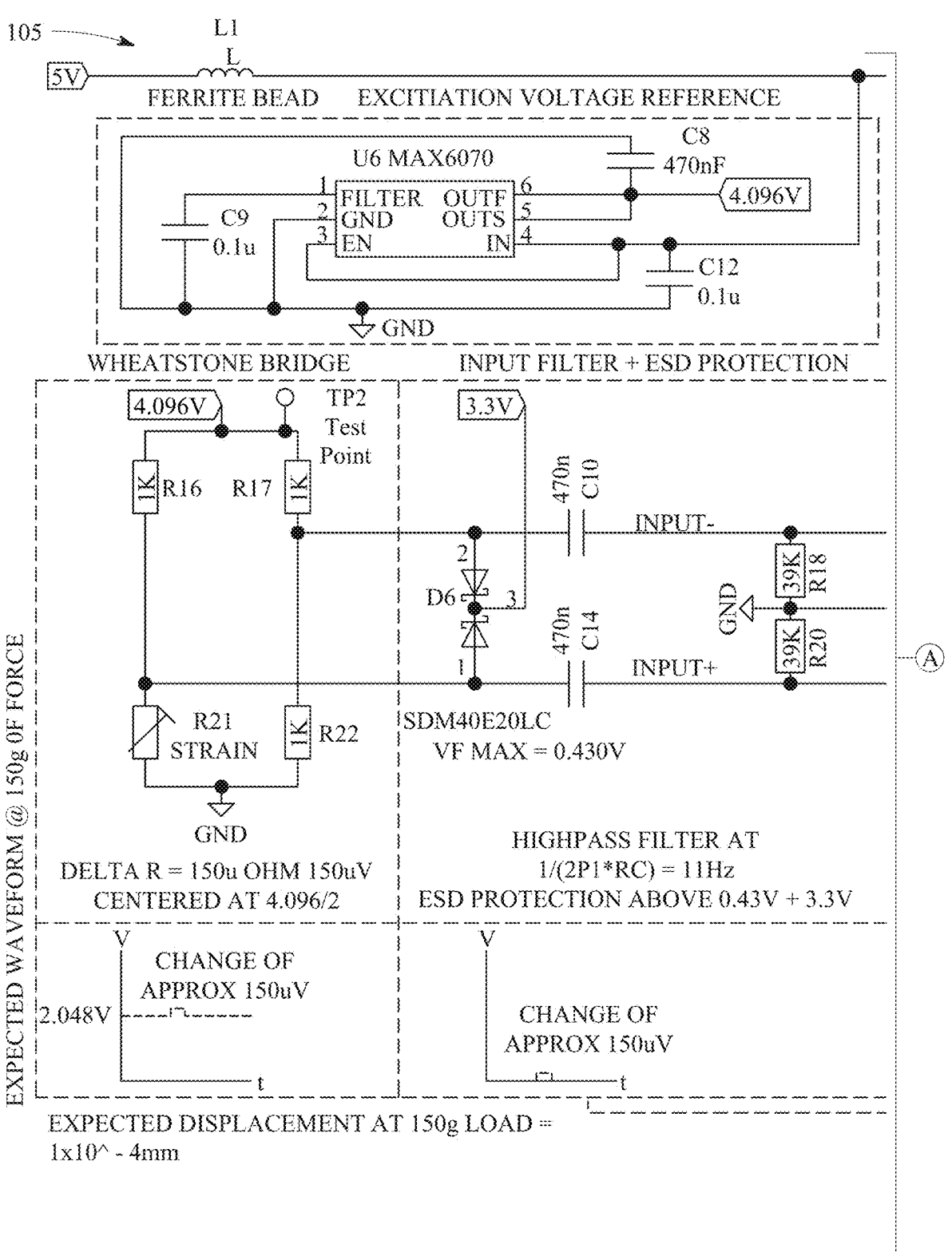
FIG. 6A depicts a left portion of an exemplary semiconductor strain gauge operable with the FIG. 1 apparatus.
Figure 6C:
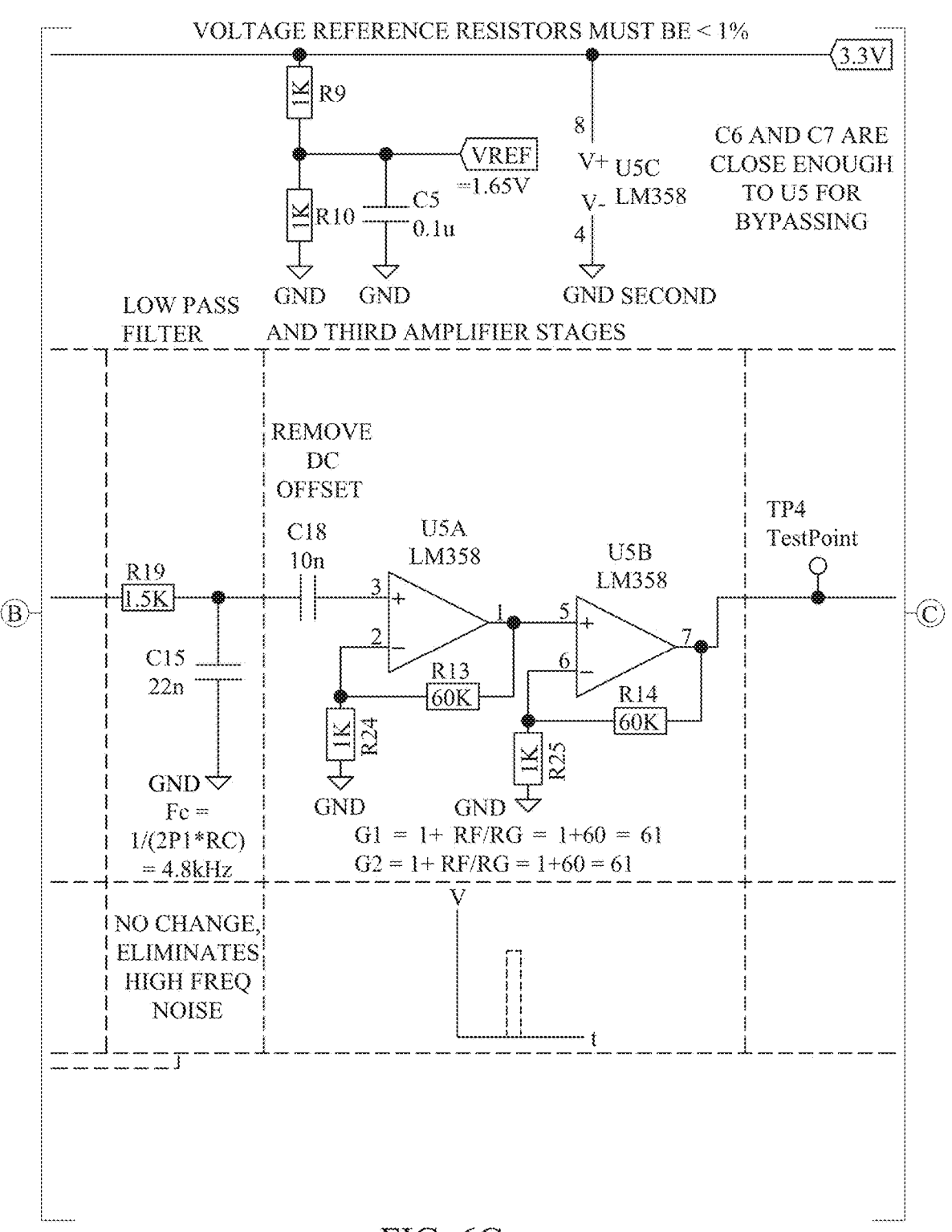
FIG. 6C depicts a center-right portion of an exemplary semiconductor strain gauge operable with the FIG. 1 apparatus.
Figure 6D:
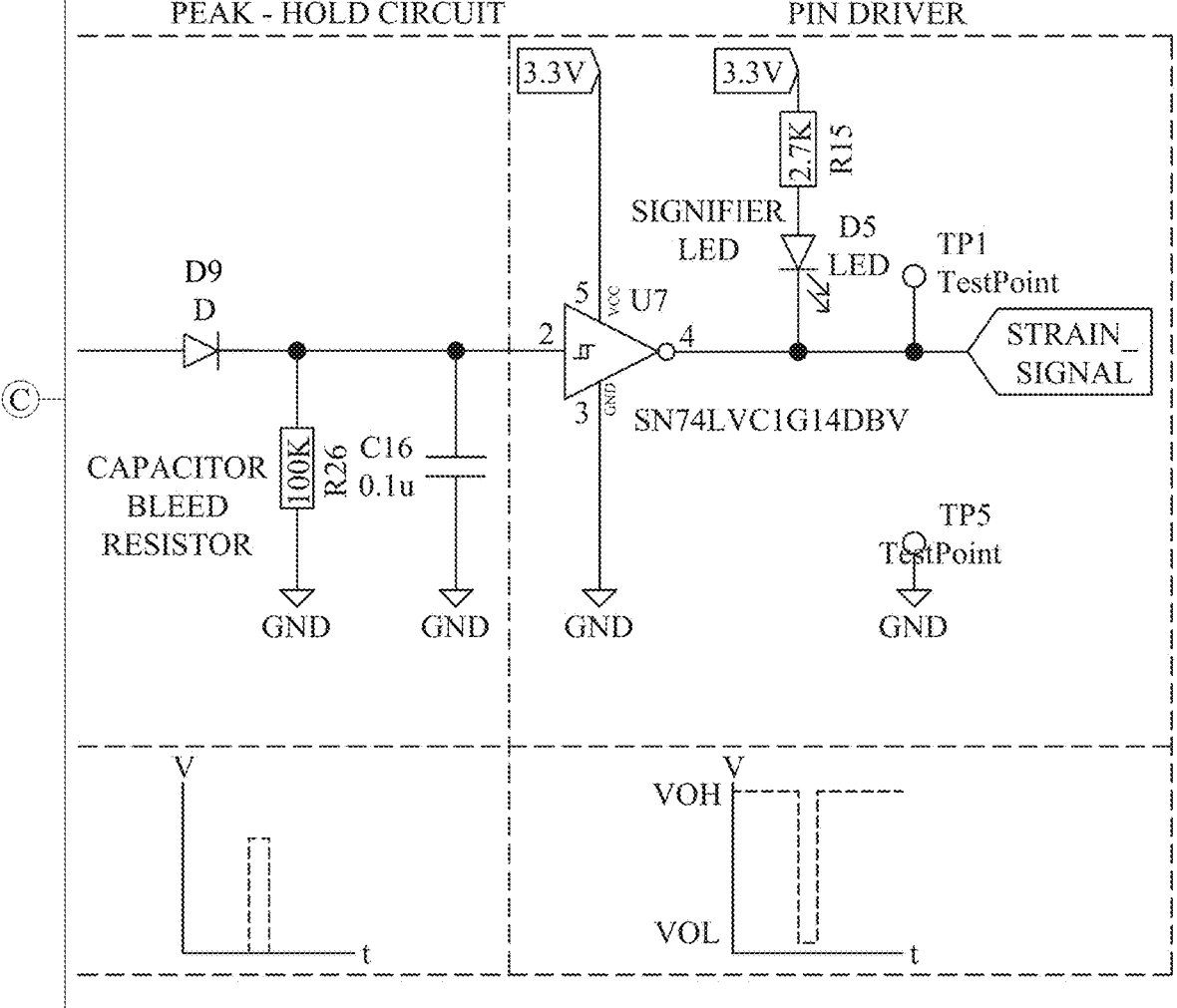
FIG. 6D depicts a right portion of an exemplary semiconductor strain gauge operable with the FIG. 1 apparatus.

Accordingly, in keeping with FIGS. 3 and 6, method 200 may comprise: outputting, with a Wheatstone bridge and a semiconductor strain gauge 105 attached to a strained region 140 of a nozzle support structure 102 that operatively attaches a nozzle 104 to a 3D printer, an analog signal responsive to a contact between nozzle 104 and a print surface, semiconductor strain gauge 105 comprising a gauge factor of between approximately 80 and approximately 200 (an outputting step 201); removing, with an R-C high-pass filter, a temperature drift portion of the analog signal during a filter stage comprising a corner frequency of between approximately 1 Hz and approximately 100 Hz (a removing step 202); increasing, with an instrumentation amplifier, a resistance to power supply noise of the analog signal during an amplifier stage comprising a gain of approximately 50 to approximately 1000 (an amplifying step 203); performing, with an AC-Coupled amplifier, an AC-Coupled amplifier stage on the analog signal comprising a gain of approximately 50 to approximately 1000 (a performing step 204); extending, with a peak-hold circuit, a duration of short pulses of the analog signal produced during the preceding steps (an extending step 205); converting, with a Schmitt trigger, the analog signal into a digital signal for detecting the contact (a converting step 206)); and/or detecting, with the 3D printer, the contact responsive to the digital signal (a detecting step 207).

As shown in FIGS. 3 and 6, for example, outputting step 201 may comprise exciting semiconductor strain gauge 105 using a traditional "Wheatstone bridge" arrangement common for resistive sensors. In this example, variations in strain gauge resistance may cause changes in voltage at the output nodes of the Wheatstone bridge. These changes may be the result of a temperature drift or a probing force 150 applied to nozzle 104 when its tip 130 contacts the print surface. In most instances, probing force 150 will produce far higher frequency (i.e., faster) variations in voltage during outputting step 201 than those produced by temperature drift.

As shown in FIGS. 3 and 6, for example, removing step 202 may comprise one or more filter stages. For example, because the voltage variations produced by temperature drift may occur at a substantially lower frequency (i.e., slower) than those produced by probing force 150, outputting step 202 may comprise removing the temperature drift portion of the analog signal from outputting step 201 with an R-C high-pass filter like that shown in FIG. 3, which has filtering components selected such that the corner frequency is between approximately 1 Hz and approximately 100 Hz. One or more passes through the R-C high-pass filter may be utilized to remove the temperature drift portion from the method 200 analog signal.

As shown in FIGS. 3 and 6, for example, amplifying step 203 may comprise using an instrumentation amplifier to increase a resistance to power supply noise of the analog signal. In this example, this first amplifier stage may be selected to have a gain of between approximately and approximately 1000 depending on desired sensitivity.

As shown in FIGS. 3 and 6, for example, performing step 204 may comprise using an AC-Coupled amplifier with a gain of approximately 50 to approximately 1000 depending on desired sensitivity. In this example, the AC-Coupled amplifier may be configured according to MAS.836, "HOW TO BIAS AN OP-AMP," Massachusetts Institute of Technology, Undated, available at: https://resenv.media.mit.edu/classarchive/MAS836/bias.pdf, the entirety of which is incorporated by reference into this disclosure.

Extending step 204 is desirable but optional. As shown in FIGS. 3 and 6, for example, extending step 204 may improve reliability by using a peak-hold (a.k.a. Envelope) circuit to extend the duration of short pulses produced in the analog signal during previous steps of method 200. In this example, the peak-hold circuit may be like those sold by Microchip Technology Inc. at https://www.microchip.com and further described by Dragos Ducu in "AN1353: Op Amp Rectifiers, Peak Detectors and Clamps," Microchip Technology Inc., 2011, available at: http://ww1.microchip.com/downloads/en/AppNotes/01353A.pdf, the entirety of which is incorporated by reference into this disclosure.

As shown in FIGS. 3 and 6, for example, converting step 206 may comprise using a Schmitt trigger to convert the analog signal into one acceptable for direct use by a controller of a 3D printer as a digital signal for detecting when tip 130 of nozzle 104 contacts the print surface. In this example, the Schmitt trigger may operate as described in "AN-140: CMOS Schmitt Trigger—A Uniquely Versatile Design Component," Fairchild Semiconductor (now part of ON Semiconductor®), 1997, available at: https://www.on-semi.cn/pub/collateral/an-140cn.pdf, the entirety of which is incorporated by reference into this disclosure.

As shown in FIG. 3, for example, detecting step 207 may comprise sending the digital signal to the controller of the 3D printer through a wired connection.

Figure 4:
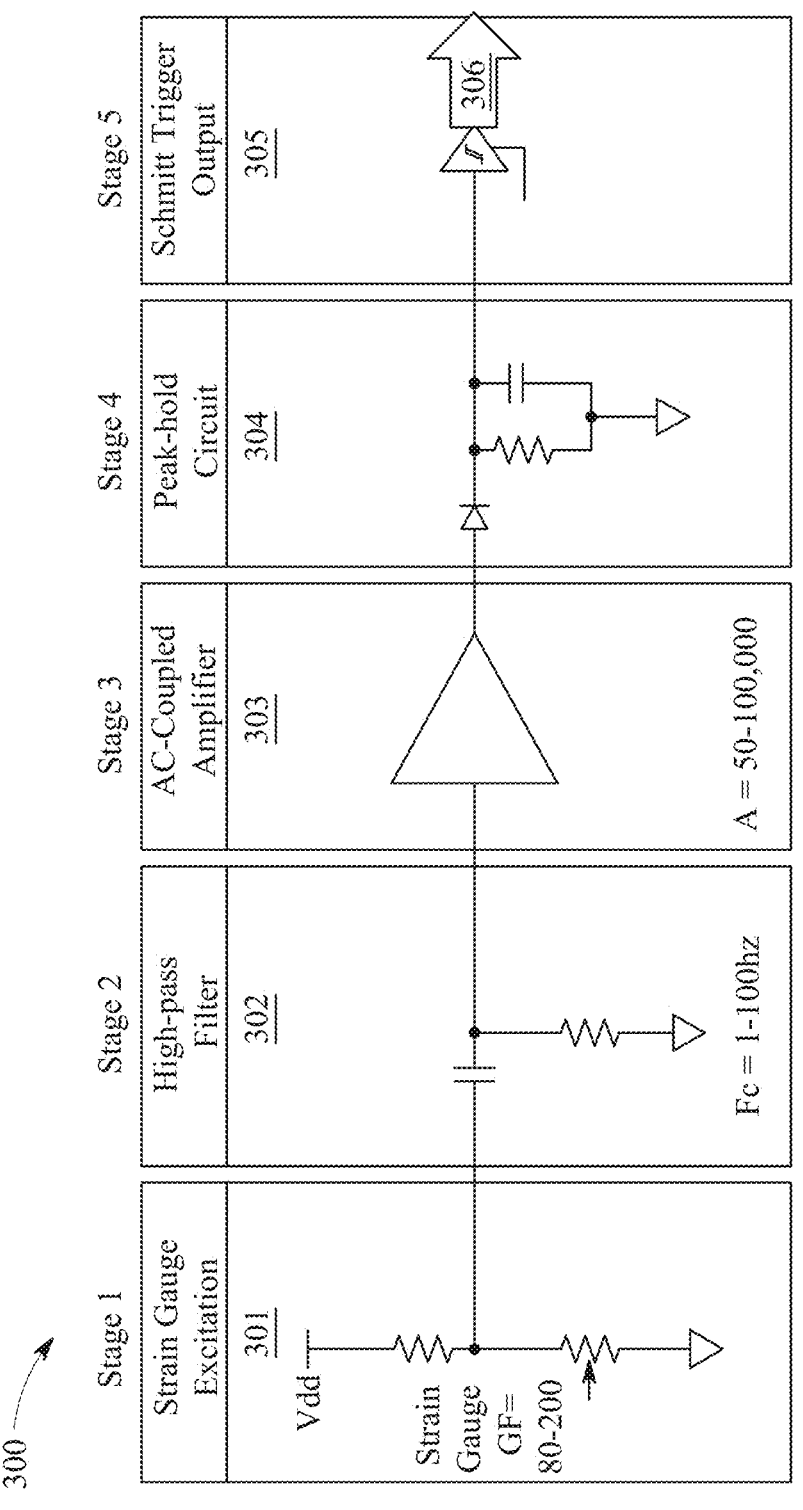
FIG. 4 depicts an exemplary method performable by the FIG. 1 apparatus.

In another aspect shown in FIG. 4, for example, semiconductor strain gauge 105 may alternatively comprise circuitry operable with a 3D printer to perform a method 300 for detecting contact between nozzle 104 and the print surface. An illustrative example of a semiconductor strain gauge 105\* with the circuitry required for to perform method 300 is shown in FIG. 7.

Figure 7:
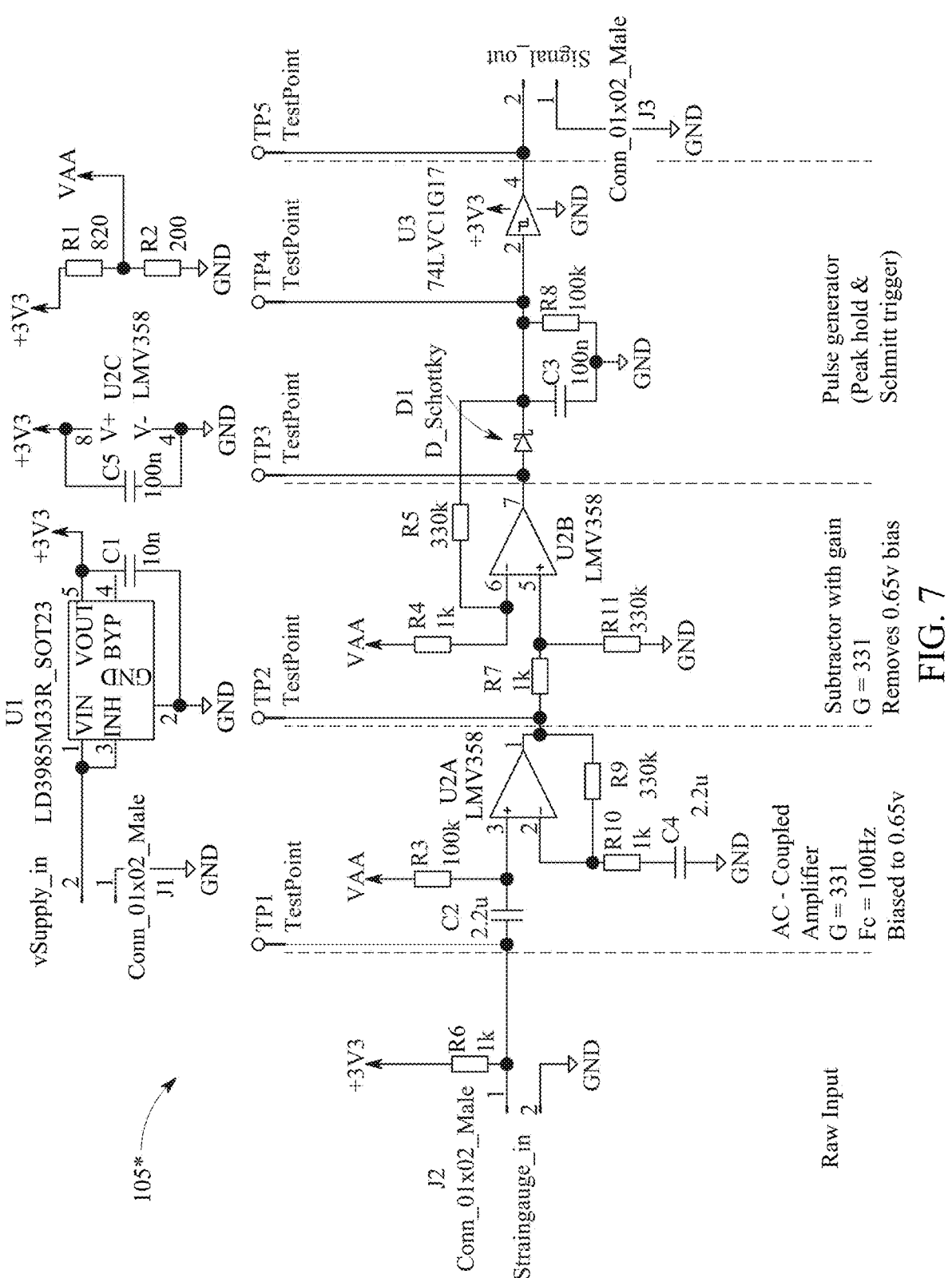
FIG. 7 depicts an exemplary semiconductor strain gauge operable with the FIG. 1 apparatus.

Accordingly, in keeping with FIGS. 4 and 7, for example, method 300 may comprise: outputting, with a voltage divider and a semiconductor strain gauge 105\* attached to a strained region 140 of a nozzle support structure 102 that operatively attaches a nozzle 104 to a 3D printer, an analog signal responsive to a contact between nozzle 104 a print surface, semiconductor strain gauge 105 comprising a gauge factor of between approximately 80 and approximately 200 (an outputting step 301); removing, with an R-C high-pass filter, a temperature drift portion of the analog signal with a filter stage comprising a corner frequency of between approximately 1 Hz and approximately 100 Hz (a removing step 302); performing, with an AC-Coupled amplifier, one or more AC-Coupled amplifier stages on the analog signal comprising a gain of approximately 50 to approximately 1,000,000 (a performing step 303); extending, with a peak-hold circuit, a duration of short pulses of the analog signal produced during the preceding steps (an extending step 304); converting, with a Schmitt trigger, the analog signal into a digital signal for detecting the contact (a converting step 305); and detecting, with the 3D printer, the contact responsive to the digital signal (a detecting step 306).

As shown in FIGS. 4 and 7, for example, outputting step 301 may comprise using a simple voltage divider constructed with semiconductor strain gauge 105\* and a voltage divider. In this example, variations in strain gauge resistance may cause change in voltage at the output nodes of the simple voltage divider. These changes may be the result of temperature drift or actual probing force 150 applied to nozzle 104 when tip 130 contacts the print surface. In most instances, probing force 150 will produce far higher frequency (i.e., faster) variations in voltage during outputting step 301 than those produced by temperature drift.

As shown in FIGS. 4 and 7, for example, removing step 302 may comprise one or more filter stages. For example, because the voltage variations produced by temperature drift occur at a substantially lower frequency (i.e., slower) than those produced by probing force 150, removing step 302 may comprise removing the temperature drift portion of the analog signal with an R-C high-pass filter like that shown in FIGS. 4 and 7, which has filtering components selected such that the corner frequency is between approximately 1 Hz and approximately 100 Hz. One or more passes through the R-C high-pass filter may be utilized to remove the temperature drift portion from the method 300 analog signal.

As shown in FIGS. 4 and 7, for example, performing step 303 may comprise using an AC-Coupled amplifier with a gain of approximately 50 to approximately 1,000,000 depending on desired sensitivity. In this example, the AC-Coupled amplifier may be configured according to MAS.836, "HOW TO BIAS AN OP-AMP," Massachusetts Institute of Technology, Undated, available at: haps://resenv.media.mit.edu/classarchive/MAS836/bias.pdf, the entirety of which is incorporated by reference into this disclosure.

Extending step 304 is desirable but optional. As shown in FIGS. 4 and 7, for example, extending step 304 may improve reliability by using a peak-hold (a.k.a. Envelope) circuit to extend the duration of short pulses produced in the analog signal during previous steps of method 300. In this example, the peak-hold circuit may be like those sold by Microchip Technology Inc. at https://www.microchip.com and further described by Dragos Ducu in "AN1353: Op Amp Rectifiers, Peak Detectors and Clamps," Microchip Technology Inc., 2011, available at: http://ww1.microchip.com/downloads/en/AppNotes/01353A.pdf, the entirety of which is incorporated by reference into this disclosure.

As shown in FIGS. 4 and 7, for example, converting step 305 may comprise using a Schmitt trigger to convert the analog signal into one acceptable for direct use by a controller of a 3D printer as a digital signal for detecting when tip 130 contacts the print surface.

As shown in FIGS. 4 and 7, for example, detecting step 306 may comprise sending the digital signal to the controller of the 3D printer through a wired connection.

In contrast with method 200, an embodiment of semiconductor strain gauge 105 configured to perform method 300, like semiconductor strain gauge 105\* of FIG. 7, for example, may eliminate several components in exchange for greatly increased sensitivity to electrical noise.

Without departing from this disclosure, a pair of semiconductor strain gauges 105 may be attached to strained region 140 to double the sensitivity of apparatus 100. Similar to as shown in FIGS. 1 and 2, for example, the pair of semiconductor strain gauges 105 may be attached to outer surface 115 of hinge connector arm 112. In this example, the pair of semiconductor strain gauges 105 may comprise circuitry operable with a 3D printer to perform a method 400 for detecting contact between nozzle 104 and the print surface with the pair of semiconductor strain gauges 105.

Figure 5:
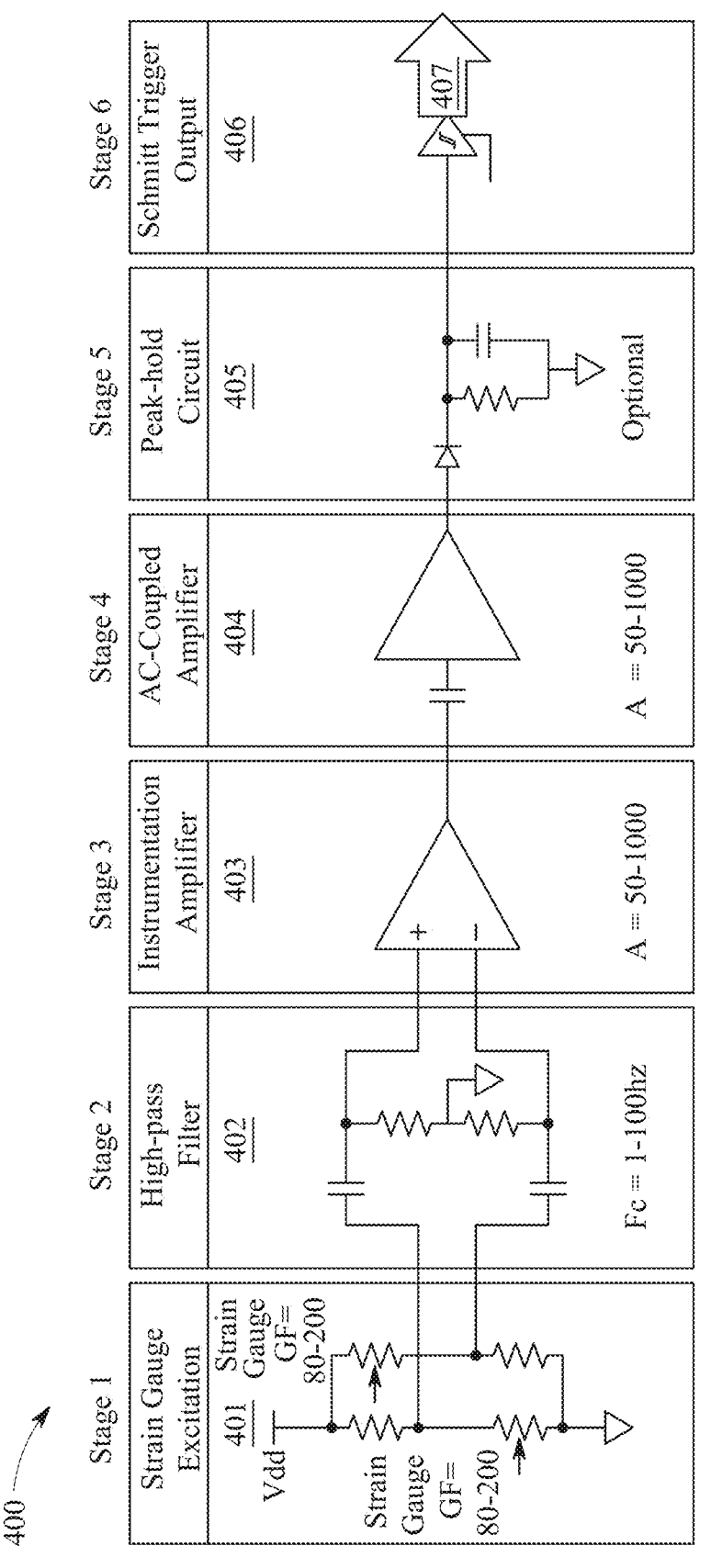
FIG. 5 depicts an exemplary method performable by the FIG. 1 apparatus.

Accordingly, in keeping with FIGS. 5 and 7, for example, method 400 may comprise: outputting, with a Wheatstone bridge and a semiconductor strain gauge attached to a strained region of a nozzle support structure that operatively attaches a nozzle to the 3D printer, an analog signal responsive to a contact between the nozzle and a print surface, the semiconductor strain gauge comprising a gauge factor of between approximately 80 and approximately 200, each leg of the Wheatstone bridge experiencing equal voltage variations of opposite polarity (an outputting step 401); removing a temperature drift portion of the analog signal by passing it through one or more filter stages comprising an R-C high-pass filter with a corner frequency between approximately 1 and approximately 100 Hz (a removing step 402); increasing, with an instrumentation amplifier, a resistance to power supply noise of the analog signal during an amplifier stage comprising a gain of approximately 50 to approximately 1000 (an amplifying step 403); performing, with an AC-Coupled amplifier, an AC-Coupled amplifier stages on the analog signal comprising a gain of approximately 50 to approximately 1000 (a performing step 404); extending, with a peak-hold circuit, a duration of short pulses of the analog signal produced during the preceding steps (an extending step 405); converting, with a Schmitt trigger, the analog signal into a digital signal (converting step 406); and detecting, with the 3D printer, the contact responsive to the digital signal (detecting 407).

As shown in FIG. 5, for example, outputting step 401 may comprise exciting semiconductor strain gauge 105 using a traditional "Wheatstone bridge" arrangement common for resistive sensors. In contrast to outputting step 201 of FIG. 3 and semiconductor strain gauge 105 of FIG. 7, for example, each leg of the Wheatstone bridge utilized to perform outputting step 401 may experience equal voltage variations of opposite polarity. The subsequent filter and instrumentation amplifier circuit described below may effectively subtract these variations, resulting in an analog signal output with outputting step 401 of method 400 (e.g., as shown in FIG. 5) that is double the magnitude of that output with outputting step 201 of method 200 (e.g., as shown in FIG. 3).

As shown in FIG. 5, for example, removing step 402 may comprise one or more filter stages. For example, because the voltage variations produced by temperature drift occur at a substantially lower frequency (i.e., slower) than those produced by probing force 150, removing step 402 may comprise removing the temperature drift portion of the analog signal from outputting step 401 with an R-C high-pass filter like that shown in FIGS. 5 and 6, which has filtering components selected such that the corner frequency is between approximately 1 Hz and approximately 100 Hz. One or more passes through the R-C high-pass filter may be utilized to remove the temperature drift portion from the method 400 analog signal.

As shown in FIG. 5, for example, amplifying step 403 may comprise using an instrumentation amplifier to increase a resistance to power supply noise of the analog signal. In this example, this first amplifier stage may be selected to have a gain of between approximately 50 and approximately 1000 depending on desired sensitivity.

As shown in FIG. 5, for example, performing step 404 may comprise using an AC-Coupled amplifier with a gain of approximately 50 to approximately 1000 depending on desired sensitivity. In this example, the AC-Coupled amplifier may be configured according to MAS.836, "HOW TO BIAS AN OP-AMP," Massachusetts Institute of Technology, Undated, available at: https://resenv.media.mit.edu/classarchive/MAS836/bias.pdf, the entirety of which is incorporated by reference into this disclosure.

Extending step 405 is desirable by optional. As shown in FIGS. 5 and 6, for example, extending step 405 may improve reliability by using a peak-hold (a.k.a. Envelope) circuit to extend the duration of short pulses produced in the analog signal during previous steps of method 400. In this example, the peak-hold circuit used in extending step 405 may be like those sold by Microchip Technology Inc. athttps://www.microchip.com and further described by Dragos Ducu in "AN1353: Op Amp Rectifiers, Peak Detectors and Clamps," Microchip Technology Inc., 2011, available at: http://ww1.microchip.com/downloads/en/AppNotes/01353A.pdf, the entirety of which is incorporated by reference into this disclosure.

As shown in FIG. 5, for example, converting step 405 may comprise using a Schmitt trigger to convert the analog signal into one acceptable for direct use by a controller of a 3D printer as a digital signal for detecting when tip 130 contacts the print surface. In this example, the Schmitt trigger may operate as described in "AN-140: CMOS Schmitt Trigger—A Uniquely Versatile Design Component," Fairchild Semiconductor (now part of ON Semiconductor®), 1997, available at: https://www.onsemi.cn/pub/collateral/an-140cn.pdf, the entirety of which is incorporated by reference into this disclosure.

As shown in FIG. 5, for example, detecting step 406 may comprise sending the digital signal to the controller of the 3D printer through a wired connection.

As demonstrated by this disclosure, in contrast to method 200 and/or 300, method 400 may utilize a pair of semiconductor strain gauges 105 to double the sensitivity of apparatus 100.

When utilized to perform any of methods 200, 300, and 400, apparatus 100 may be described as a uniquely analog solution for utilizing nozzle probing to calibrate a 3D printer by compensating for temperature drift while achieving high sensitivity. Several advantages of apparatus 100 are apparent from this disclosure. For example, apparatus 100 may leverage the high gauge factor of semiconductor strain gauge 105 without active temperature compensation schemes or specialized sensors or gauge elements, allowing for higher sensitivity, higher stiffness, or both as desired. As a further example, apparatus 100 may eliminate the need for high-resolution (i.e., 24-bit) ADCs, their associated low-noise power supplies, and other design overhead required to support them. As yet another example, apparatus 100 also may eliminate a need to modify the printer controller.

Without departing from this disclosure, apparatus 100 may be operable to perform a method 500 comprising: operatively attaching a nozzle to a 3D printer with a nozzle support structure (an attaching step 501); and calibrating a Z-offset between a print surface and the nozzle by: moving, with the 3D printer, the nozzle to a plurality of different locations on the print surface (a moving step 502); at each location plurality of different locations: causing, with the 3D printer, a contact between the nozzle and the print surface that causes a strained region of the nozzle support structure to experience a surface strain of between approximately $1\times10^{-7}$ and approximately $1\times10^{-4}$ responsive to the contact (a causing step 503); generating, with a semiconductor strain gauge attached to a strained region of the nozzle support structure, an analog signal responsive to the surface strain, the semiconductor strain gauge comprising a gauge factor of between approximately and approximately 200 (a generating step 504); and converting, with the semiconductor strain gauge, the analog signal into a digital signal detectable by the 3D printer (a converting step 505); and determining, with the 3D printer, the Z-offset at each location of the plurality of different locations based on the digital signal associated with that location (a determining step 506).

While principles of the present disclosure are described herein with reference to illustrative aspects for particular applications, the disclosure is not limited thereto. Those having ordinary skill in the art and access to this disclosure will recognize additional modifications, applications, aspects, and substitution of equivalents all fall in the scope of the described aspects. Accordingly, the present disclosure is not to be considered as limited by the foregoing description.

The invention claimed is:

1. An apparatus comprising:
a nozzle support structure that operatively attaches a nozzle to a 3D printer and comprises a strained region that experiences a surface strain of between approximately $1\times10^{-7}$ and approximately $1\times10^{-4}$ responsive to a contact between the nozzle and a print surface; and
a semiconductor strain gauge that is attached to the strained region and operable to generate an analog signal and output a digital signal responsive to the surface strain, the semiconductor strain gauge comprising a gauge factor of between approximately 80 and approximately 200, the digital signal being detectable by the 3D printer,
the nozzle support structure comprising:
a nozzle block extending outwardly from an extruder body for attachment to the nozzle and a heat block;
a hinge connector arm extending outwardly from the extruder body; and
a flexure bearing hinge that extends between the nozzle block and the hinge connector arm and flexes when a tip of the nozzle contacts the print surface,
wherein a flexure of the flexure bearing hinge causes the strained region to experience the surface strain.

2. The apparatus of claim 1, wherein the nozzle support structure extends outwardly from an extruder body operable to output a molten flow of 3D printable material.

3. The apparatus of claim 2, wherein the nozzle support structure comprises metallic structures that are formed integral with the extruder body.

4. The apparatus of claim 1, wherein:
a flexible portion of the nozzle support structure flexes when a tip of the nozzle contacts the print surface; and
a flexure of the flexible portion causes the strained region to experience the surface strain.

5. The apparatus of claim 1, wherein the nozzle block, the hinge connector arm, and the flexure bearing hinge are made of the same material and the flexure bearing hinge consists of a living hinge connecting the nozzle block and the hinge connector arm.

6. The apparatus of claim 1, wherein the nozzle block comprises:
a long leg extending outwardly from the extruder block;
a short leg connected to the flexure bearing hinge;
a bottom leg connecting the long leg and the short leg; and
an interior space defined by interior surfaces of the extruder block, the long leg, the bottom leg, and the short leg.

7. The apparatus of claim 6, wherein:
the heat block is attached to the bottom leg and the nozzle; and
the apparatus comprises:
a delivery tube extending from the extruder body, through the interior space, through the bottom leg, and through the heat block for connection to the nozzle; and
a heat sink surrounding a portion of the delivery tube in the interior space.

8. The apparatus of claim 6, comprising a hinge connector arm base extending outwardly from the extruder body to support the hinge connector arm, wherein a rigidity of the hinge connector arm base is greater than a rigidity of the hinge connector arm.

9. The apparatus of claim 8, wherein a bottom surface of the hinge connector arm base and a top surface of the short leg are spaced apart define a flexure gap that permits the top surface to move toward the bottom surface when the flexure bearing hinge flexes.

10. The apparatus of claim 9, wherein the strained portion comprises an outside surface of the hinge connector arm and the semiconductor strain gauge is located on the outside surface.

11. The apparatus of claim 1, wherein the strained portion comprises an outside surface of the nozzle support structure that experiences the surface strain when a flexible portion of the nozzle support structure flexes responsive to the contact.

12. The apparatus of claim 1, wherein the semiconductor strain gauge comprises one or more of:

a Wheatstone bridge operable to output the analog signal responsive to the contact;

an R-C high-pass filter operable to remove a temperature drift portion of the analog signal;

an instrumentation amplifier operable to increase a resistance to power supply noise of the analog signal;

an AC-Coupled amplifier operable to perform an AC-Coupled amplifier stage on the analog signal;

a peak-hold circuit operable to extend a duration of short pulses of the analog signal; and a Schmitt trigger operable to convert the analog signal into the digital signal after passing through one or more of the R-C high-pass filter, the instrumentation amplifier, the AC-Coupled amplifier, and the peak-hold circuit.

13. The apparatus of claim 12, wherein each leg of the Wheatstone bridge experiences equal voltage variations of opposite polarity.

14. The apparatus of claim 1, wherein the semiconductor strain gauge is operable to generate the analog signal and output the digital signal by:

outputting, with a Wheatstone bridge and the semiconductor strain gauge, the analog signal responsive to the contact;

removing, with an R-C high-pass filter, a temperature drift portion of the analog signal during a filter stage comprising a corner frequency of between approximately 1 Hz and approximately 100 Hz;

increasing, with an instrumentation amplifier, a resistance to power supply noise of the analog signal during an amplifier stage comprising a gain of approximately 50 to approximately 1000;

performing, with an AC-Coupled amplifier, an AC-Coupled amplifier stage on the analog signal comprising a gain of approximately 50 to approximately 1000;

converting, with a Schmitt trigger, the analog signal into the digital signal.

15. The apparatus of claim 14, wherein each leg of the Wheatstone bridge experiences equal voltage variations of opposite polarity.

16. The apparatus of claim 1, wherein the semiconductor strain gauge comprises one or more of:

a voltage divider operable to output the analog signal responsive to the contact;

an R-C high-pass filter operable to remove a temperature drift portion of the analog signal;

an AC-Coupled amplifier operable to perform an AC-Coupled amplifier stage on the analog signal;

a peak-hold circuit operable to extend a duration of short pulses of the analog signal; and a Schmitt trigger operable to convert the analog signal into the digital signal after passing through one or more of the R-C high-pass filter, the AC-Coupled amplifier, and the peak-hold circuit.

17. The apparatus of claim 1, wherein the semiconductor strain gauge is operable to generate the analog signal and output the digital signal by:

outputting, with a voltage divider and the semiconductor strain gauge, the analog signal responsive to the contact;

removing, with an R-C high-pass filter, a temperature drift portion of the analog signal with a filter stage comprising a corner frequency of between approximately 1 Hz and approximately 100 Hz;

performing, with an AC-Coupled amplifier, one or more AC-Coupled amplifier stages on the analog signal comprising a gain of approximately 50 to approximately 1,000,000; and converting, with a Schmitt trigger, the analog signal into the digital signal.

18. The apparatus of claim 1, comprising the nozzle, the 3D printer, and the print surface, wherein the strained portion comprises an outside surface of the nozzle support structure that experiences the surface strain when a hinge of the nozzle support structure flexes responsive to the contact.

19. The apparatus of claim 18, wherein the 3D printer is operable with the semiconductor strain gauge to calibrate a Z-offset between the print surface and the nozzle by:

moving, with a processor of the 3D printer, the nozzle to a plurality of different locations on the print surface;

at each location plurality of different locations:

causing, with the processor, one contact between the nozzle and the print surface that causes the strained region to experience the surface strain;

generating, with the semiconductor strain gauge, the analog signal responsive to the surface strain; and converting, with the semiconductor strain gauge, the analog signal into the digital signal;

outputting, with the semiconductor strain gauge, the digital signal to the 3D printer; and determining, with the processor of the 3D printer, the Z-offset based on the digital signal.

20. An apparatus comprising:

an extruder body;

a heat block;

a nozzle support structure that operatively attaches a nozzle to a 3D printer and comprises a strained region that experiences a surface strain of between approximately $1 \times 10^{-7}$ and approximately $1 \times 10^{-4}$ responsive to a contact between the nozzle and a print surface; and a semiconductor strain gauge that is attached to the strained region and operable to generate an analog signal and output a digital signal responsive to the surface strain, the semiconductor strain gauge comprising a gauge factor of between approximately 80 and approximately 200, the digital signal being detectable by the 3D printer, the nozzle support structure comprising:

a nozzle block extending outwardly from the extruder body for attachment to the nozzle and the heat block;

a hinge connector arm extending outwardly from the extruder body; and a flexure bearing hinge that extends between the nozzle block and the hinge connector arm and flexes when a tip of the nozzle contacts the print surface, wherein a flexure of the flexure bearing hinge causes the strained region to experience the surface strain.

* * * * *